US006814273B2

(12) United States Patent
Sullivan et al.

(10) Patent No.: US 6,814,273 B2
(45) Date of Patent: Nov. 9, 2004

(54) FLATWIRE REPAIR TOOL SYSTEMS AND METHODS

(75) Inventors: Anne Marie Sullivan, Dearborn, MI (US); Xu Song, Canton, MI (US); Lakhi N. Goenka, Ann Arbor, MI (US); Yutaka Kawase, Yokohama (JP); Cuong-Van Pham, San Diego, CA (US); Bhavani Shankar Tata, Canton, MI (US); Peter Joseph Sinkunas, Canton, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 10/241,898

(22) Filed: Sep. 12, 2002

(65) Prior Publication Data

US 2004/0050910 A1 Mar. 18, 2004

(51) Int. Cl.[7] .......................... B23K 37/04; D06F 75/08
(52) U.S. Cl. ............................. 228/4.5; 228/9; 228/42; 228/49.5; 228/55; 219/242; 219/245
(58) Field of Search ............................. 228/119, 264, 228/4.5, 180.5, 9, 19, 20.5, 49.1, 49.5, 51, 54, 55, 42; 219/56, 56.1, 56.21, 56.22, 242, 245, 85.16, 85.1

(56) References Cited

U.S. PATENT DOCUMENTS

| | | | | |
|---|---|---|---|---|
| 3,696,985 A | * | 10/1972 | Herring et al. | ............... 228/5.5 |
| 4,220,845 A | * | 9/1980 | Morreale | |
| 4,351,468 A | * | 9/1982 | Floury et al. | ................ 228/4.5 |
| 4,529,869 A | * | 7/1985 | Ekstrom, Jr. | |
| 4,543,716 A | | 10/1985 | Damiano et al. | |
| 4,563,563 A | | 1/1986 | Ege | |
| 4,659,004 A | * | 4/1987 | Fridman | ...................... 228/6.2 |
| 4,872,825 A | * | 10/1989 | Ross | .......................... 425/117 |
| 5,126,527 A | | 6/1992 | Haehner | |
| 5,190,468 A | | 3/1993 | Nichols, III et al. | |
| 5,229,575 A | * | 7/1993 | Waller et al. | ................ 219/233 |
| 5,260,548 A | * | 11/1993 | Todd et al. | .................. 219/483 |
| 5,264,674 A | * | 11/1993 | Mangan et al. | ........... 219/56.22 |
| 5,412,181 A | * | 5/1995 | Giamati | |
| 6,193,544 B1 | | 2/2001 | McGinnis | |
| 2001/0027962 A1 | * | 10/2001 | Moro | |
| 2002/0074379 A1 | * | 6/2002 | Kim | |

* cited by examiner

Primary Examiner—Kiley Stoner
(74) Attorney, Agent, or Firm—Brinks Hofer Gilson & Lione

(57) ABSTRACT

A system and method for reworking, repairing and upgrading flatwire is disclosed. A repair tool for reworking and/or repairing the flatwire is disclosed for creating subsequent electrical and mechanical joints of equal or greater quality as compared to the original system. The repair tool includes a heating blade, a power controller, a tool assembly, an inerting system, a cooling system, a flatwire cassette, a tool material, a flatwire material, an upgrade/repair procedure and various other aspects for rapidly heating flatwire two join two separate portions of the flatwire. The system and method of the present invention addresses the challenges of working with substrate materials which typically degrade at temperatures commonly used to form solder joints. Further, the soldering tool of the present invention may be a portable, lightweight unit that can be used in the field, for automotive and aerospace applications.

28 Claims, 16 Drawing Sheets

FLATWIRE REPAIR TOOL SYSTEMS AND METHODS

TECHNICAL FIELD

The present invention relates to flatwire conductive systems and method and to methods and devices for repairing and replacing portions of the flatwire conductive systems.

BACKGROUND

Flatwire conductors are being proposed and developed for automotive applications to increase valuable packaging space. The continuous and totally integrated interconnect network has eliminated conventional interconnect nodes where easy repairs and reworks were performed.

The lack of practical repair/rework methods has slowed the application of flatwire technology. Therefore, a strategy for reworking, repairing and upgrading flatwire systems is critical to the implementation of the technology, The necessary equipment and operational procedures for the rework and repair should provide an electrical and mechanical joint of equal or greater quality as compared to the original system.

Furthermore, a new and improved system and method for repairing flatwire systems should address the challenges of (a) working with substrate materials which typically degrade at temperatures commonly used to form solder joints, (b) working in the service field, (c) providing an accelerated joining process thereby preventing damage to the plastic substrate, (d) joining various polyesters, polyamides and other polymeric substrate materials having various trace geometries and interconnected materials (i.e. solder), and (e) preventing ignition of flammable vapors during the repair process.

SUMMARY

In an aspect of the present invention a method for reworking, repairing and upgrading flatwire technology is provided. Furthermore, a repair tool for reworking and/or repairing the flatwire is provided for creating subsequent electrical and mechanical joints of equal or greater quality as compared to the original system.

In an embodiment of the present invention, a heater, a heating blade, a power controller, a tool assembly, an inerting system, a cooling system, a flatwire cassette, a tool material, a flatwire material, an upgrade/repair procedure and various other aspects for rapidly heating flatwire two join two separate portions of the flatwire is provided.

The present invention addresses the challenges of working with substrate materials which typically degrade at temperatures commonly used to form solder joints.

The soldering tool of the present invention is a portable, lightweight unit that can be used in the field, for automotive and aerospace applications.

The soldering tool uses a rapid peak temperature rise with feedback control and a controlled contact mechanism for adjoining the flatwire (with or without a patch) for the purpose of establishing a metallurgical interconnection. The joining process is accelerated to occur in a brief time (less than 1 second) in order to not damage the plastic substrate.

A heat pulse waveform is provided by the soldering to be used with polyester, polyimide and other polymeric substrate materials, various trace geometries and interconnect materials (i.e. solder).

An inerting system is also provided to prevent ignition of flammable vapors around the heater during repair. The system maintains an oxygen level which is below 5 percent. The system also maintains cooler exterior tool surfaces.

These and other aspects and advantages of the present invention will become apparent upon reading the following detailed description of the invention in combination with the accompanying drawings.

DETAILED DESCRIPTION

Figure 1A:
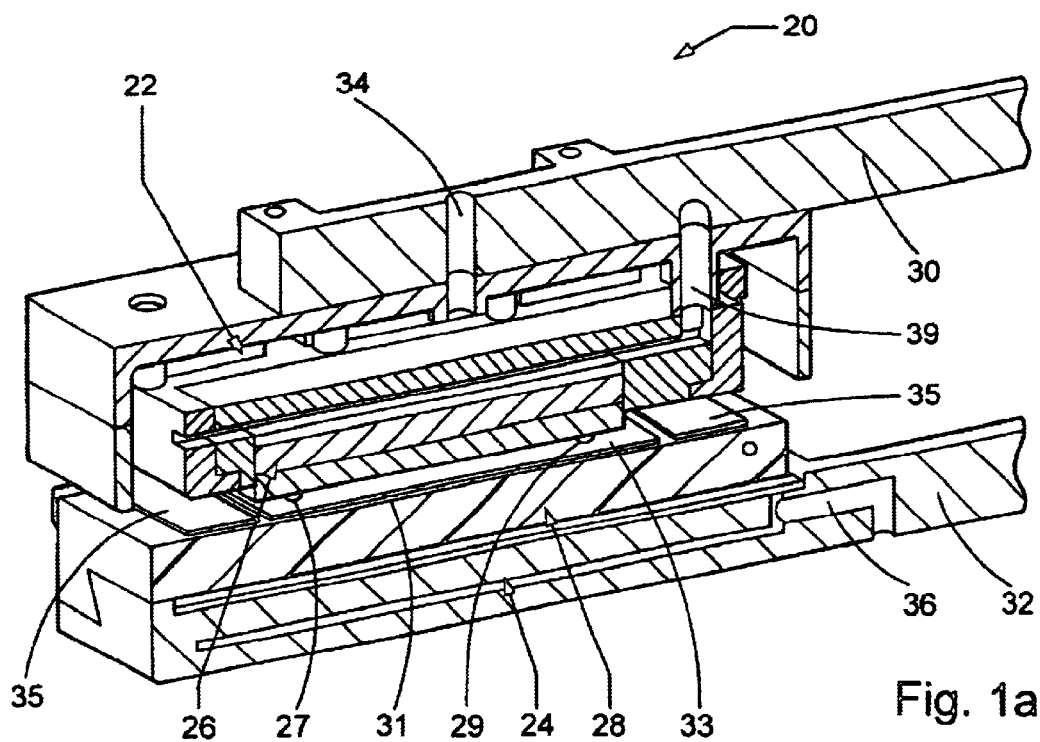
FIG. 1a is a perspective view of a soldering tool, in accordance with the present invention.
Figure 1B:
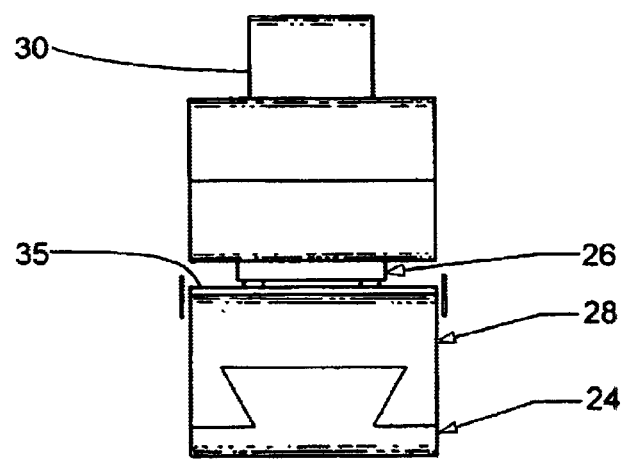
FIG. 1b is an end view of the soldering tool, in accordance with the present invention.
Figure 2A:
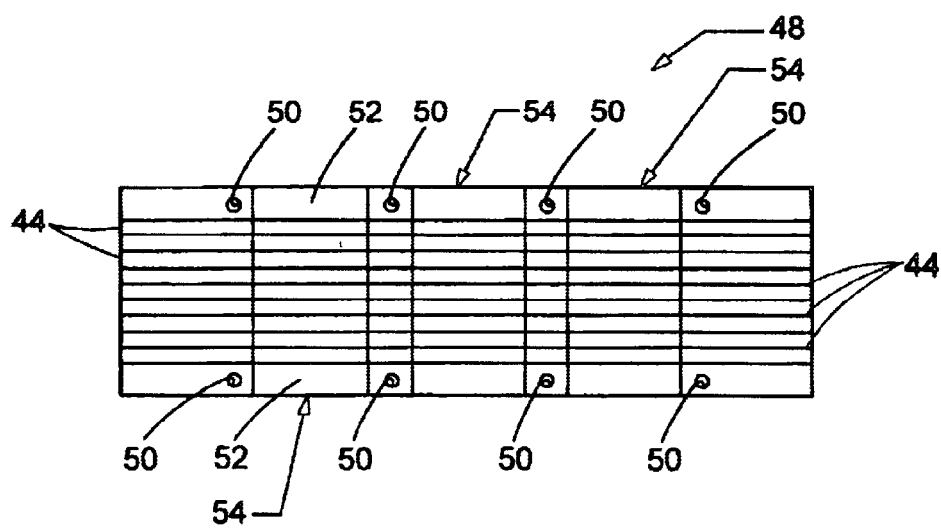
FIGS. 2a–2d are plan views of a flatwire, in accordance with the present invention.
Figure 2B:
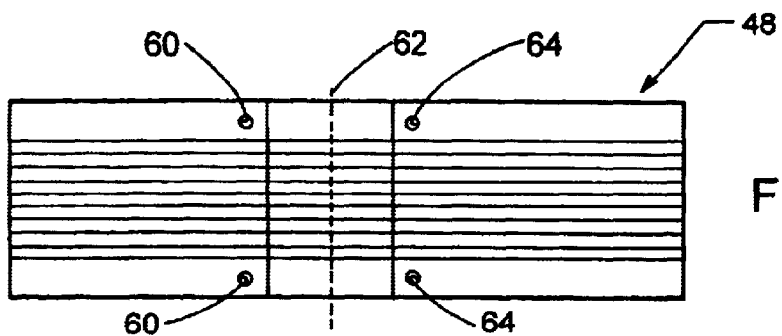
Figure 2C:
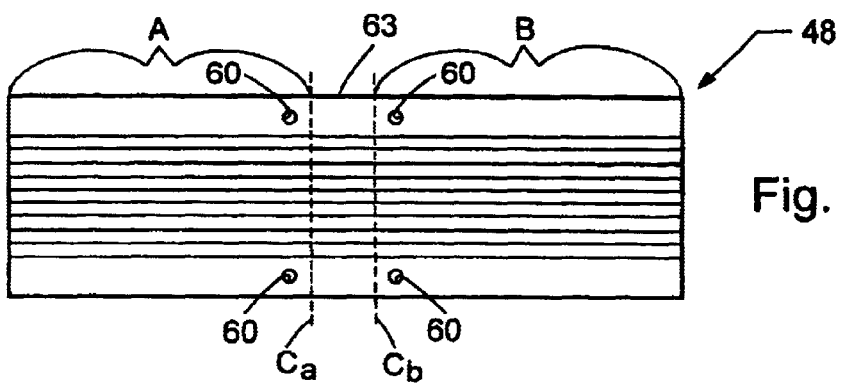

The present invention provides a soldering tool 20 as illustrated in FIG. 1a and 1b in perspective and end views for upgrading, repairing and/or servicing flatwire 48 (shown in FIG. 2a). Tool 20 is compatible with several flatwire materials. For example, the present invention contemplates flatwire materials comprised of PET (polyethylene terephthalate), FR-4 (thin), FR-5 (thin), or polyamide or similar material. Such flat wire material is generally flexible and typically has a thickness of 1–5 mils. Soldering tool 20 is configured to position and align two separate portions or pieces of flat wire 48 and then join the two pieces by reflowing solder disposed on the pieces.

Accordingly, soldering tool 20 includes a top inerting manifold 22, a bottom inerting manifold 24, a heater 26, a cassette 28 and clamping arms 30 and 32. Cassette 28 slidably engages bottom inerting manifold 24. Heater 26 opposes cassette 28 and is affixed to top inerting manifold 22. Inerting gas is pumped into top inerting manifold 22 through inerting passages 34 and through bottom inerting manifold 24 through bottom inerting passages 36. A pair of arms or handles 30 and 32 are affixed to top inerting manifold 22 and to bottom inerting manifold 24 respectively, providing means for a tool operator to grasp tool 20.

The tooling pins 27, 29 disposed on cassette 28 assist in easy handling and alignment of the flatwire. A loading feature 35 of cassette 28 ensures that flatwire 48 stays flat against a loading surface 31 of cassette 28 and the cutting location is exposed. Loading feature 35 may be spring-loaded to stretch or tension the features.

In order to improve the efficiency of tool 20, cassette 28 may either be covered with a low thermally conductive material or may be preheated. Examples of low thermal conductive materials include ceramic paper, polyimide or Teflon©. Cassette 28 may be preheated using a flexible flat heater 33 (see FIG. 1a) made of silicon-rubber and having heating wire or elements disposed therein on a silicon rubber substrate.

Heater 26 is configured to have a high thermal efficiency, quick heating response, uniform temperature over the heating edge, capability to self-adjust the temperature during soldering, materials impervious to solder and flux (nonadherent, as welt), good thermal shock resistance, and good thermal wear resistance.

Figure 1C:
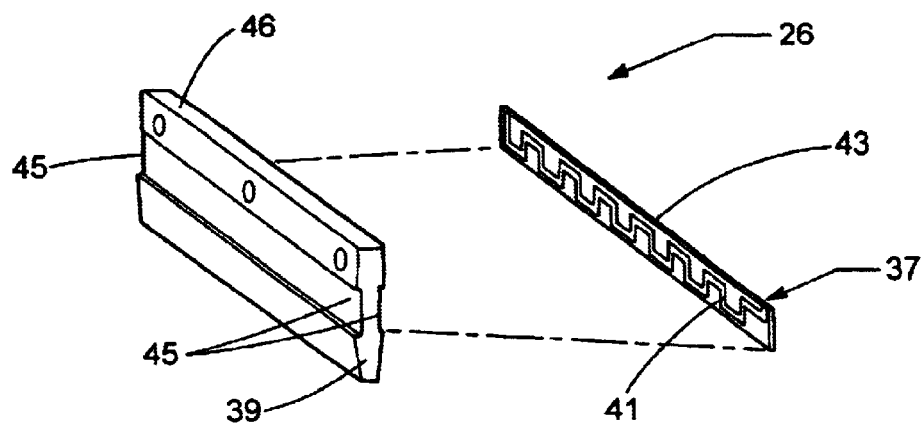
FIG. 1c is a perspective view of a heater for use in the soldering tool, in accordance with the present invention.

In an embodiment of the present invention, heater 26 includes a heating element 37 that is planar, as shown in FIG. 1c. Further, heating element 37 has a resistor 41 in the shape of a repeating U-pattern and is bonded to a ceramic substrate 43. An exposed side of the element or heating side is covered by a dielectric to prevent an electrical short The heating side of the element directly contacts a metal blade 39 so that the heating element heats the blade more efficiently. In order to heat blade 39 more uniformly, an additional heating element 37 may be attached to opposite sides of the blade. If the overall size of the blade and the heating elements is a concern, a single element on one side of the blade is acceptable. A slot 45 is provided on either side of blade 38 to hold the heating elements 37 in position. If space is available, heating element 37 may be placed on a top surface 46 of blade 39.

Figure 1D:
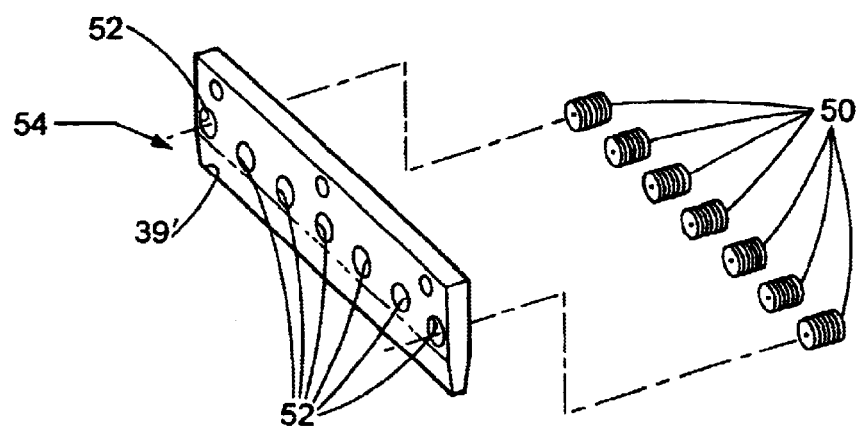
FIG. 1d is a perspective view of an alternate heater embodiment for use with a soldering tool, in accordance with the present invention.

In an alternate embodiment of heater 26, as shown in FIG. 1d, a plurality of short-tube heating elements 50 are provided. Short-tube heating elements 50 are inserted into apertures 52 of blade 39'. Generally, the thick resistance film 41 is spirally bonded to either a tube or cylinder type of substrate while the resistor is electrically protected with a dielectric coating. For example, a resistance heating alloy wire, coated with a dielectric, can be spiraled over a ceramic tube to form a similar heating element. The through holes 52 at the lower region 54 of blade 39' hold elements 50 in place. In operation, the heating elements 50 heats up blade 39' from the inside of holes 52.

Figure 1E:
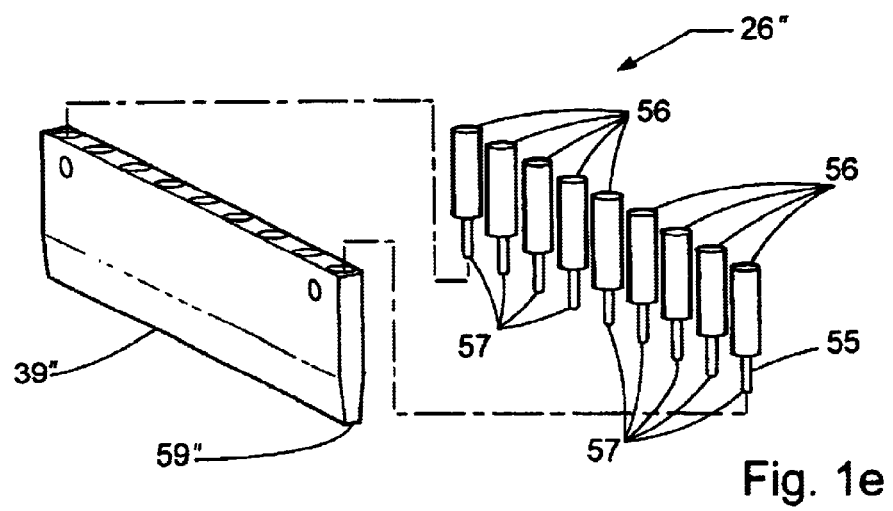
FIG. 1e is a perspective view of yet another embodiment of a heater for use with a soldering tool, in accordance with the present invention.

In yet another embodiment a probe type of heating element 26" is provided to heat a blade 39" illustrated in FIG. 1e. The probe-heating element 26" can be made of either a thick resistance film or a resistance alloy wire 55, spirally wound over the surface of a ceramic tube 56. A plurality of deep holes disposed in blade 39' receive wire 55 bringing the heating tips 57 closer to a heating. edge 59 of blade 39". A dielectric coating is deposited on the heating elements that provide good thermal conduction and electrical isolation as well. The upper part of the heating element provides a mechanical fixture and a ceramic tube for passing electrical connectors.

Figure 1F:
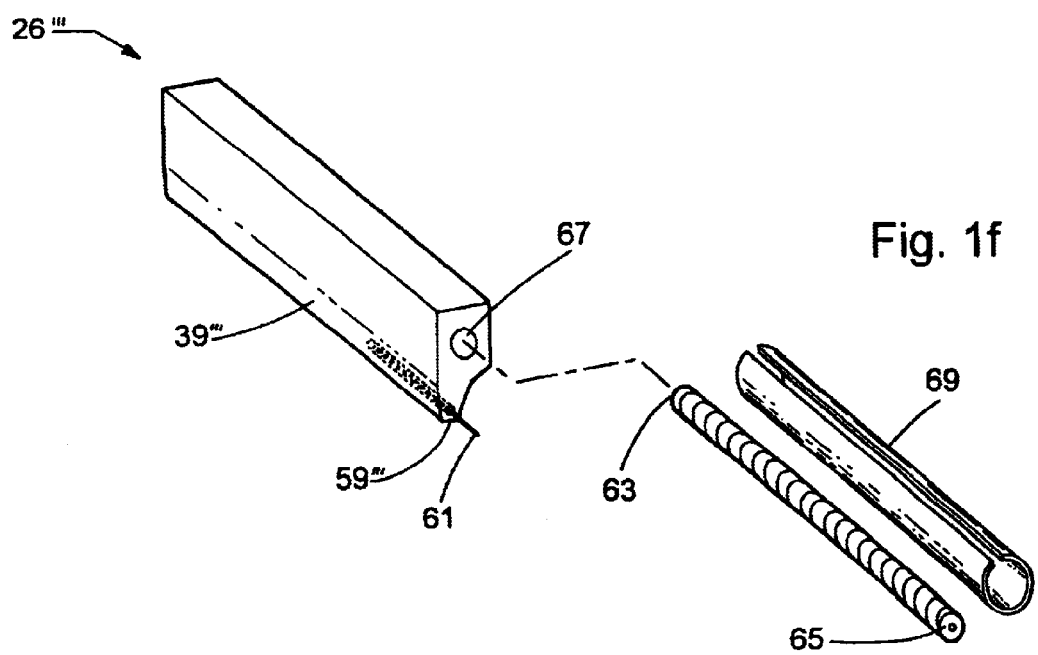
FIG. 1f is a perspective view of still another heater embodiment for use with a soldering tool, in accordance with the present invention.

Still alternatively, a longitudinal-tube type heater 26'" is provided, as shown in FIG. 1f. Heater 26'" is constructed using either a thick resistance film or a resistance alloy wire 63 spiraled over a ceramic tube 65. The resistor wire 63 is coated with a dielectric forming a plurality of dielectric layers, which provide good thermal conduction and electrical protection. A through-hole 67 is drilled in blade 39'" along the longitudinal direction of the blade so that the wire 63 and ceramic tube 65 assembly may be inserted into through-hole 67 of blade 39'".

Longitudinal tube type heater 26'" has a heat spreader 69 disposed over wire 63 and ceramic tube 65. Heat spreader 69 improves temperature uniformity across blade 39'". The heat spreader 69 is made of a high thermally conductive metal such as copper while the blade is made preferably of titanium. The heat sourced from wire 63 will be redistributed by spreader 69 so that uniform temperature will be provided along a blade surface 59'". Additionally, in order to improve heat transfer through a blade to the flatwire, an air gap can be added between spreader 69 and the heating element, on the three sides not in the critical heat transfer path.

In all of the heating element embodiments mentioned above, the resistors are connected to the electrical connectors or lead frames by various conventional methods so that electrical power can be supplied to resistors. Preferably, the mechanical load is only applied to a top surface of the blade.

Preferably, for all heater embodiments described above, the heating elements should be physically close to the heating-edge 59", 59''', so that any temperature modification in the heating element are reflected at the edge of the blade closest to the flatwire as quickly as possible.

The blade 59 may be constructed of metals, such as brass, molybdenum, and stainless steel. However, to avoid the solder and flux adhering to the heating edge of the blade and reduce heat lose from blade, a titanium blade is preferred.

Figure 1G:
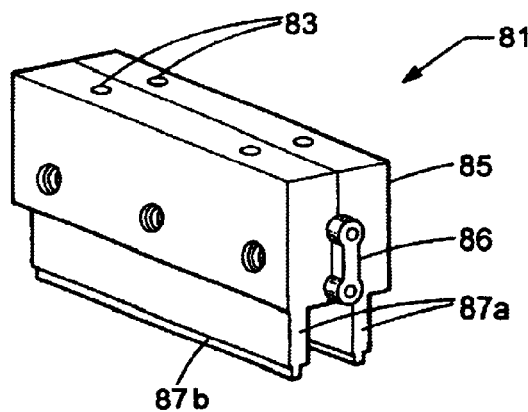
FIG. 1g is a perspective view of still another embodiment of heater assembly for use in the soldering tool, in accordance with the present invention.

In yet another embodiment, a heater 81 is illustrated in FIG. 1g is provided for heating flatwire to reflow solder paste disposed thereon. Heater 81 is fixedly mounted within tool 20 and attached to the upper portion 22 through a plurality of fastener holes 83 disposed in a cover 85. Further, heater 81 includes a pair of heater subassemblies 87a and 87b. A connector plug 86 is further provided for communicating electrical power to the heater subassemblies 87a and b.

Figure 1H:
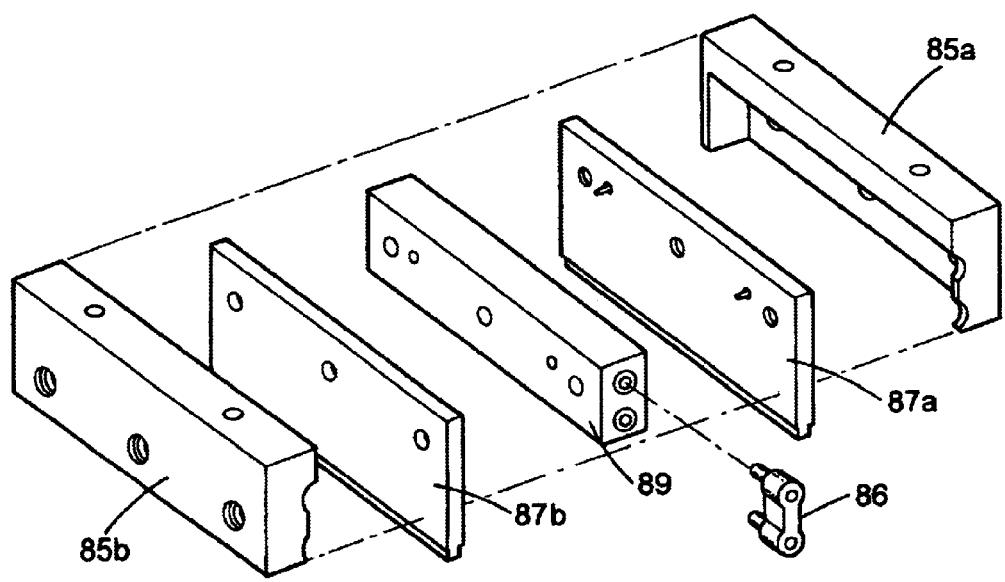
FIG. 1h is an exploded view of the heater illustrated in FIG. 1g, in accordance with the present invention.

Referring now to FIG. 1h, an exploded perspective view of heater 81 is illustrated. As shown, a housing 89 is sandwiched between heater subassemblies 87a and 87b. Preferably housing 89 is made of a thermally non-conducting material, such as plastic. Further, cover 85 includes two portions 85a and 85b, which meet to form cover 85.

Figure 1I:
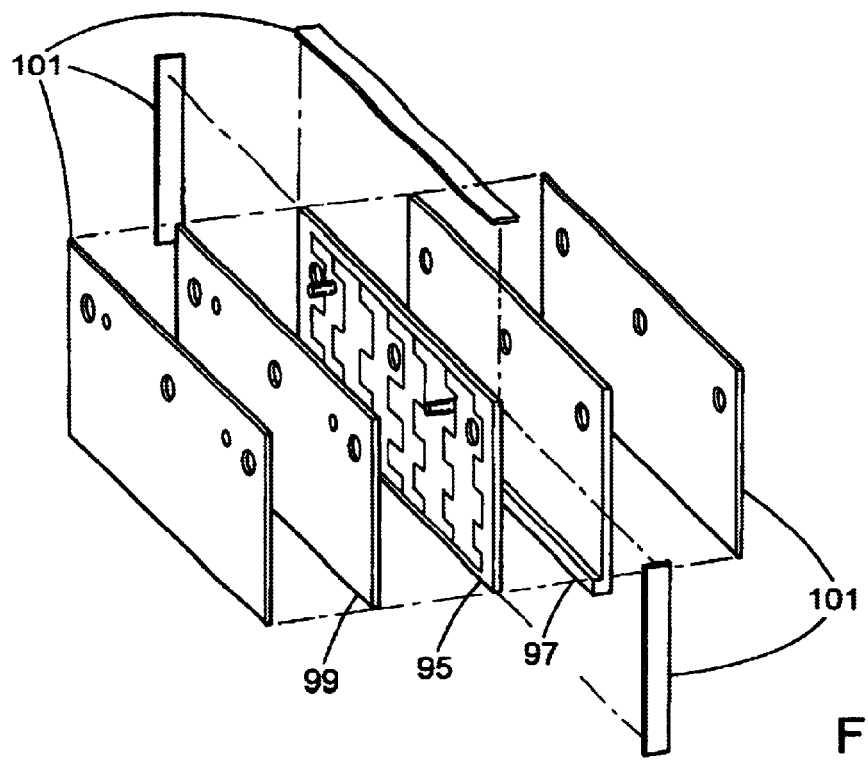
FIG. 1i is an exploded view of a heater subassembly shown in FIG. 1h, in accordance with the present invention.

Referring now to FIG. 1i, an exploded perspective view of the heater subassemblies 87a and 87b is illustrated. Heater subassemblies 87a and b include a heating element 95 comprised of a ceramic substrate having a resistive heating wire screen printed thereon. Heating element 95 is positioned against a blade 97 preferably made of brass and configured to transmit heat to a flatwire surface. A metal cover 99 is placed over heating element 95. In order to concentrate the heat energy emanating from heating element 95, a plurality of heating blades 101 are disposed on the outer surfaces of the metal cover, heating element, metal bade assembly.

Figure 1J:
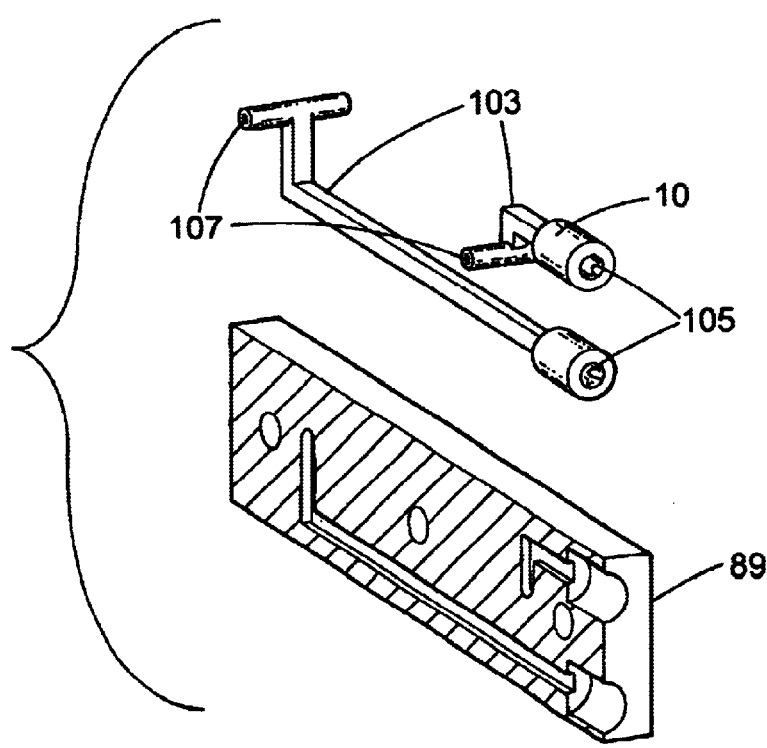
FIG. 1j is a perspective view of a housing for transmitting electrical energy to the heater element shown in FIG. 1i, in accordance with the present invention.

Referring now to FIG. 1j, a detailed illustration of housing 89 is shown. Housing 89 includes a metal lead frame 103 for providing power to heating element 95. Lead frame 103 include power connection ends 105 and heating element connector ends 107. Preferably, lead frame 103 is insert molded within, housing 89.

Preferably, temperature sensor 61 (thermocouples) are placed in blade 39''', in order to monitor the temperature level at the heating edge. For example, a thermocouple may be placed at one of corners of the blade 39''' and extend as far as the middle of the blade (see FIG. 1f). For example, a thermocouple is placed inside of the blade or attached to the outer surface of the blade, where it can be close to the middle point of the soldering surface. The thermocouple should be as close to the hot surface or working surface 59''' as possible, preferably less than 1 mm. Preferably the thermocouple is sensitive to temperature changes. The maximum delay time should be less than 0.1 seconds.

Figure 1K:
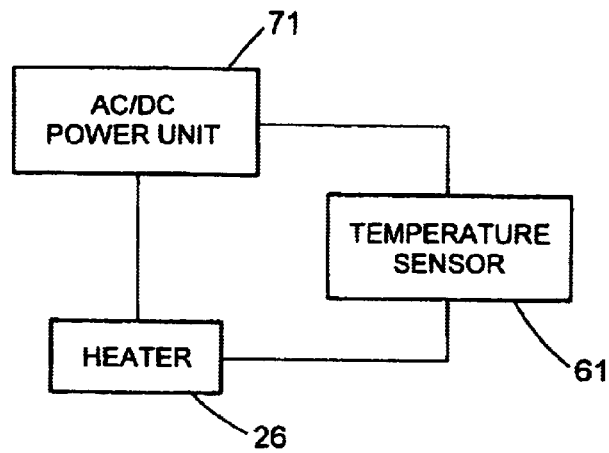
FIG. 1k is a block diagram of a heater control system for controlling heat generated by the heater element in the solder tool, in accordance with the present invention.
Figure 1L:
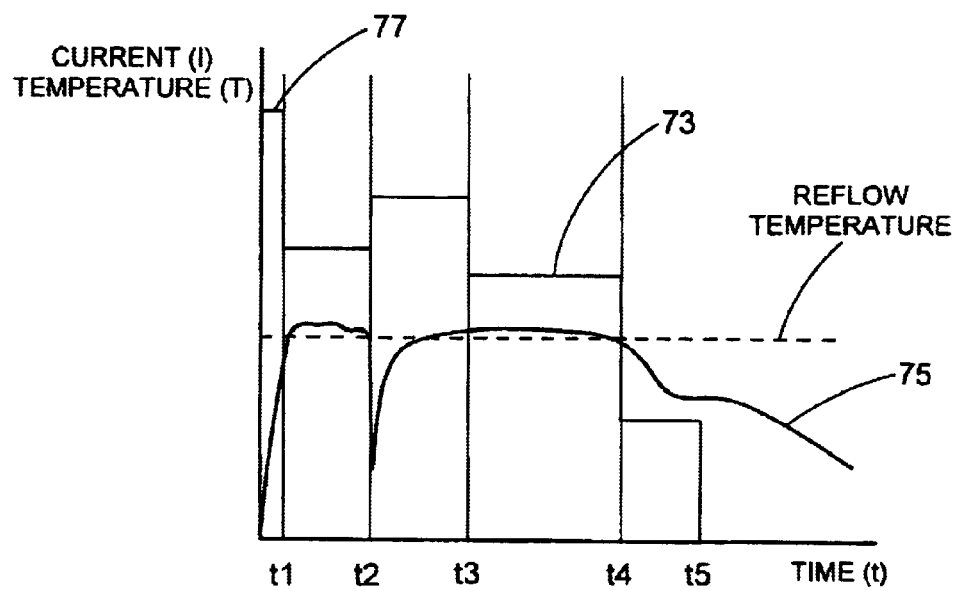
FIG. 1l is a chart illustrating the electrical current input to the heater in the corresponding temperature output at the working surface of the blade, in accordance with the present invention.

A control circuit for controlling heater 26 is illustrated in FIG. 1k. A power control unit 71 is provided to supply AC/DC, with either a variable current at a constant voltage or a variable voltage to supply a constant current, to heater 26. The temperature response of the heater to current input 73 is shown in FIG. 1l. Power control unit 71 in the control loop monitors the temperature level read by thermal sensors at finite time increments and adjusts the current supply to keep heater temperature 75 within a narrow window.

In operation, the power is switched on and an initial high current pulse 77 (under a constant voltage) brings the heater temperature up very quickly as shown in FIG. 11. Meanwhile, the control unit keeps scanning all data channels from thermal sensors. When the temperature readings exceed the operation temperature at a time t1, the current is reduced to set the temperature back to the expected level. At time t2, the heater temperature drops sharply while heater comes into contact with the repair area. When the control unit detects such temperature drop, another high current pulse raises the temperature upwards to an operational level (i.e. reflow the solder). At a time t3, the current is reduced again as the temperature readings are satisfied. A time t4 the cooling process is initiated. At a time t5, the power is switched off and the heater cools down gradually.

Figure 1M:
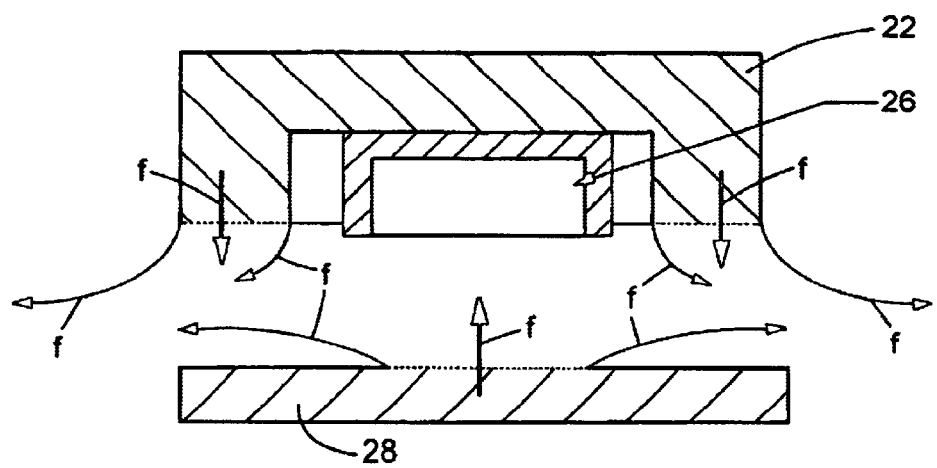
FIG. 1m is a schematic representation of the soldering tool illustrating the flow of inert gas between the upper and lower portions of the soldering tool frame, in accordance with the present invention.

In order to ensure the safety of the operator, when near fuel (aerospace or automotive), soldering tool 20 is blanketed with an inert gas, such as nitrogen. The inert gas will prevent oxygen from getting to the heated areas (i.e. heater 26) of the tool. Soldering tool 20 is attached to a nitrogen source (not shown) and has channels surrounding heater 26. Thus, a blanket of an inert gas around tool 26 is provided. The flow of inert gas (as indicated by arrows q will extend to the flatwire and cassette 28, enveloping portions of the tool having elevated temperatures, as shown in FIG. 1m. The inert gas is also fed into cassette 28 to assist in cooling the flatwire, after the soldering process.

This inerting system maintains an inert atmosphere (less than 12,000 ppm oxygen) around heater 26 to prevent ignition of fuel vapors while in operation. The blanket of inert gas eliminates the need for an enclosure and provides cool exterior surfaces of tool 20 by shielding the hot regions of the tool (i.e. heater 26). Similarly, the inert gas flow keeps adjacent flatwire regions cool during repair and provides rapid cooling of heater 26 after use.

With reference now to FIGS. 2a–2e, flatwire 48 typically has a plurality of copper layers 40 and dielectric layers 42. An adhesive 43 is used between the copper and dielectric layers, or in other embodiments of the present invention, flatwire 48 is adhesive-less. Along any section or portion of flatwire 48, there may be multiple traces 44 of the same or varying widths and spacings. Any given section or portion of flatwire 48 should be singulated into widths of 10 mm to 100 mm. Furthermore, flatwire 48 may be either single or double sided, having copper traces 44 of 1–4 ounces disposed onto a top surface or bottom surface of dialectric layer 42.

Generally, the section of flatwire 48 to be soldered will have a width less than or equal to 80 mm. A plurality of tooling holes 50 are provided on an outside edge 52 of the flatwire, and are disposed in line with or near a soldering zone 54. Portions of traces 44 that are in soldering zone 54 are protected with either a SnPb plating (at least 0.5 mil thick), HASL, OSP or immersion silver deposit. A solder mask is deposited on portions of traces 44 that are not in soldering zone 54, as well as on the dielectric between copper traces 44. Alternatively, a protection tape may be used over this deposit/preservative. Preferably the tape would be placed over soldering zone 54 during manufacturing, and removed prior to soldering.

In another embodiment of the present invention each soldering zone 54 of flatwire 48 (original, upgrade, repair and service pieces), is designated and labeled with a bar code. The bar code will be read prior to any changes, in order to ensure proper materials and processes are used during the upgrade, repair and/or service.

The original flatwire piece will have the reliability equal to the reliability of the copper traces under the soldermask (not in the soldering zone). The original flatwire piece is cut prior to assembling the upgrade/repair flatwire and completing the soldering process.

In yet another embodiment of the present invention flatwire 48 is fitted with cassette 28. Cassette 28 acts as a support base or fixture that ensures the integrity of flatwire 18 during repair. Cassette 28 is a low-profile platform that is slidably positioned under an original and a replacement flatwire portions. Cassette 28 supports to the underside of soldering zone 54, and acts as a thermally insulated handling device for ease of use and safety by a tool operator. Further, cassette 28 assists in nitrogen inerting of the tool and nitrogen cooling of the flatwire, heater(s) and the tool. A pair of alignment pins 27 and 29 ensures alignment of traces 44.

Cassette 28 is keyed to soldering tool 20, such that there is only one way to insert cassette 28 into the tool, and such that only the designated areas on the flatwire/repair patch are exposed to the heaters or cutting blade. The cassette ensures intimate contact between flatwire portions to be joined/soldered prior to tool operation.

A flatwire repair patch may be used, where the patch is placed over the flatwire. Otherwise, the two flatwire portions may be joined by overlapping the flatwire creating a lap joint.

If the repair is a double sided repair, a second repair patch may be placed in cassette 28 first, before placing the flatwire portions to be joined on top. Alternatively, a second patch may be added later in the soldering process.

Figure 2D:
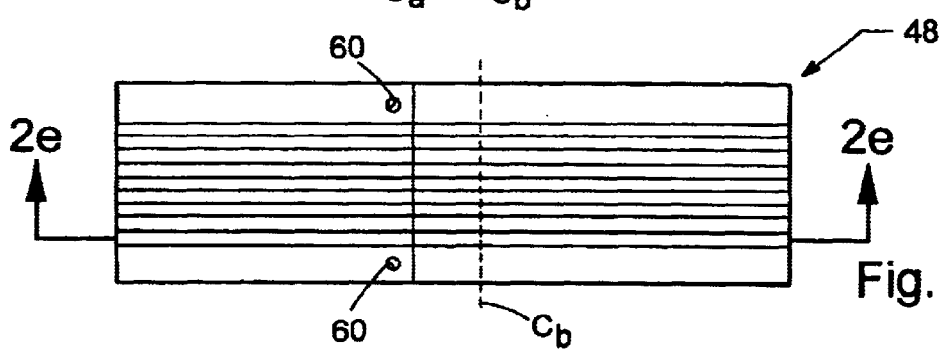
Figure 2E:
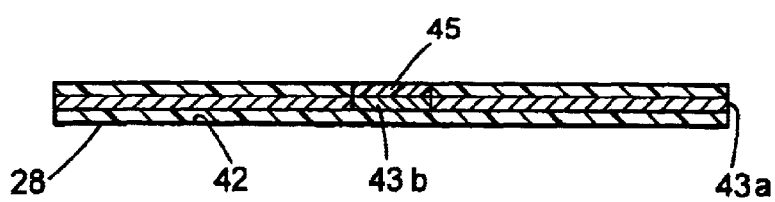
FIG. 2e is a cross-sectional view through the flatwire at a location indicated in FIG. 2d, in accordance with the present invention.
Figure 3A:
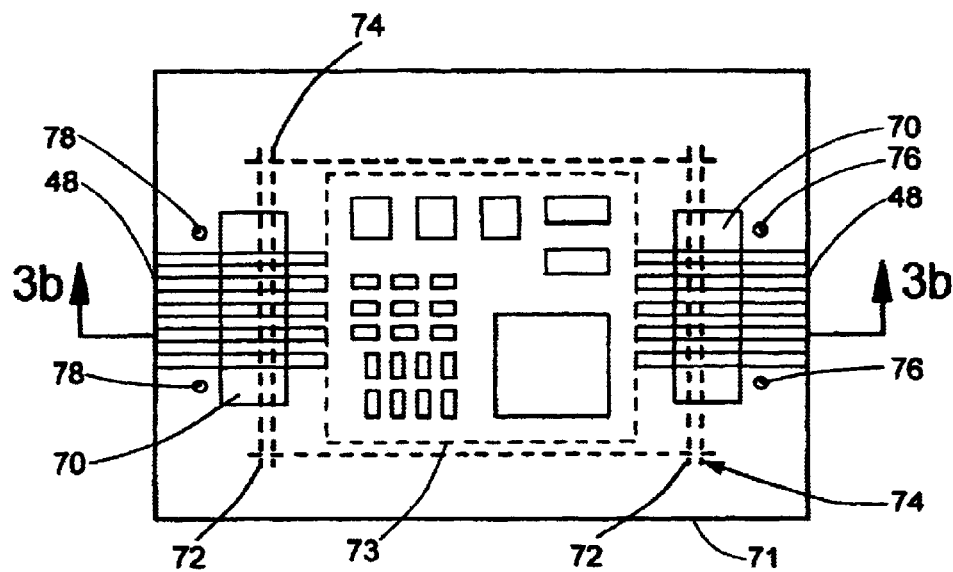
FIGS. 3a–3b are plan and cross-sectional views through a flatwire and molded housing, in accordance with the present invention.
Figure 3B:
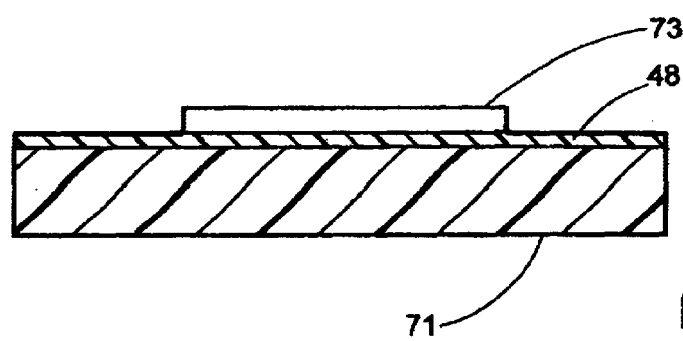

As shown in FIGS. 2b–2e, two predefined alignment holes 60 positioned on the same side of a cutting line 62 are used for aligning the cutting line with the cassette or a cutter edge. Another pair of alignment holes 64 are located opposite alignment holes 60 such that cutting line 62 is disposed between alignment holes 60 and 64. This configuration allows a cutting tool easy access to the cutting line from either side of the cable, at an operator's convenience. After cutting along line 62, flatwire portions A and B have a repair zone 63. So the possibility of miscutting is eliminated no matter which portion A or B needs repairing. For example, if portion A needs repairing (as shown in FIG. 2d) the operator would cut along cut line Ca and if portion B needs repairing the operator would cut along cut line Cb.

Where flatwire is connected to a molded housing, as shown in FIG. 3, two cutting lines 72 and 74 are required in the soldering zone. After cutting, the cut strip can be peeled off from flatwire to disconnect the original electrical circuit. At least two predefined alignment holes 76 and 78 adjacent each cutting line, are used to align the desired cutting lines with a cutter edge. Thus, the cutting tool can easily access the cutting position from the opposite direction of the flatwire at an operator's convenience.

In an embodiment of the present invention, tools for cutting FFC, FFS or other flatwire at a repair or soldering site so that the damaged or nonfunctional units can be removed is provided. The cutting tools provide a precise, clean and effective way to separate failed nonfunctional flatwire. The cutting tools perform punch cutting, gradual cutting, and rotator cutting. In embodiments of the present invention, the cutting tools are configured to be portable, have a bar code reading and GPS positioning capabilities (with the appropriate software).

Figure 4A:
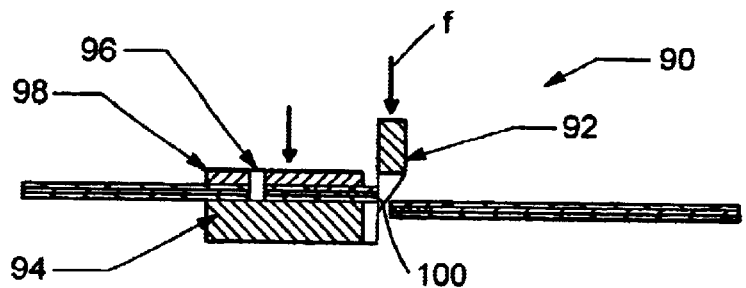
FIG. 4a is a cross-sectional view illustrating a punch method for severing the flatwire, in accordance with the present invention.
Figure 4B:
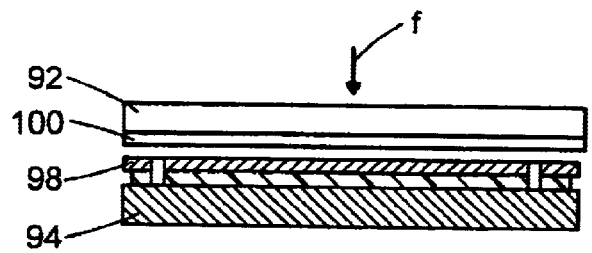
FIG. 4b is a front view of a punch cutting tool for punch cutting the flatwire, in accordance with the present invention.

With reference to FIGS. 4a–4d, flatwire cutting methods are illustrated, in accordance with the present invention. Punch cutting, as illustrated in FIG. 4a, is primarily used for flatwire that is not supported by a molded housing (as shown in FIG. 3a). A punch cutting tool 90 includes a cutter 92, a support base 94, alignment pins 96 with an adjuster, and a clamping plate 98. In operation, the alignment pins 96 are inserted into a pair of alignment holes in the flatwire and are used to align the cutting line on base 94. Clamping plate 98 contacts the flatwire to stabilize the cutting line. Cutter 92 having a cutting edge 100 is driven towards the flatwire, equally by a force-through mechanism in a direction indicated by arrow f, to separate the flatwire along the cutting line at one time by a shearing action. The punch cutting tool 90 is preferably used to cut flatwire having fine traces.

Figure 4C:
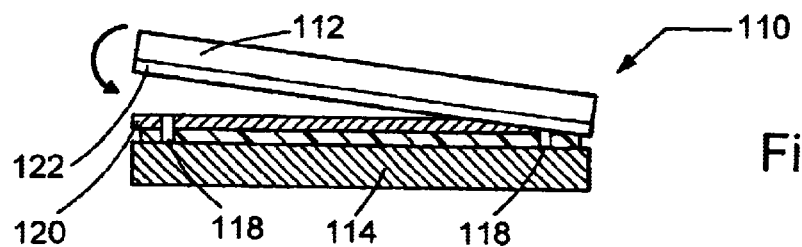
FIG. 4c is a front view of a cutting tool for severing the flatwire, in accordance with the present invention.

FIG. 4c illustrates a method for cutting flatwire referred to herein as gradual cutting. A gradual cutting tool 110 includes a gradual cutter 112, a base 114, alignment pins 118 with an adjuster, and a clamping plate 120. In operation, alignment pins 118 are inserted into a pair of positioning or alignment holes in the flatwire to align the cutting line with respect to base 114. Clamping plate 120 contacts the flatwire to secure the cutting line and keep the flatwire from moving. When gradual cutter 112 having cutting edge 122 pivots toward base 114, the flatwire is sheared and separated along the cutting line. Gradual cutting tool 110 is preferably used on flatwire having heavy or wide traces.

Figure 5A:
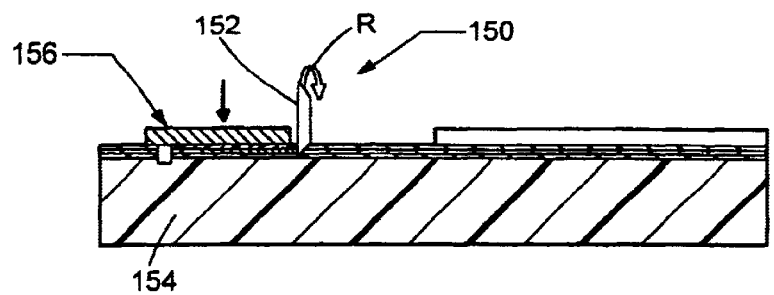
FIGS. 5a–5d are cross-sectional views through a flatwire and flatwire cutting tool illustrating a rotary method for severing the flatwire, in accordance with the present invention.
Figure 5B:
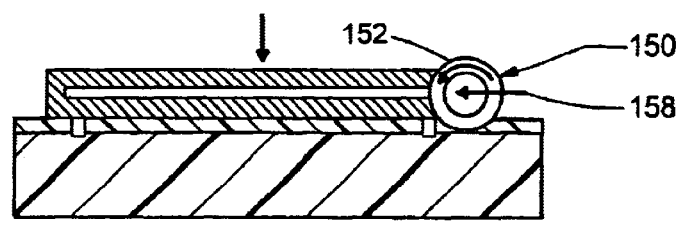

With reference to FIGS. 5a–5b, a rotary cutting method is illustrated. Rotary cutting is particularly useful for severing flatwire attached to a molded housing (as shown in FIG. 3a). A rotary cutting tool 150 includes either a single- or double-cutting-edge. The cutter 152 can be driven by either an electric motor or by a manually applied force in a direction indicated by arrow R. In the manual version, tool 150 includes a rotator cutter(s), cutter holder, cutting depth adjuster, adjustable spring position pins, guiding ruler, and a handle. In the automated version, an electric motor is added. In operation, a movable position pin is adjusted so that the position pins can fit in alignment holes disposed in the flatwire. The cutting depth or cutter 152 may be adjusted to avoid over-cut and further damage of molding substrate 154.

Figure 5C:
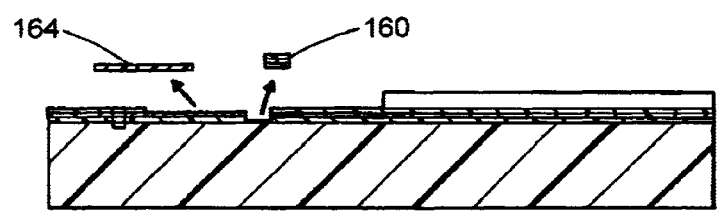
Figure 5D:
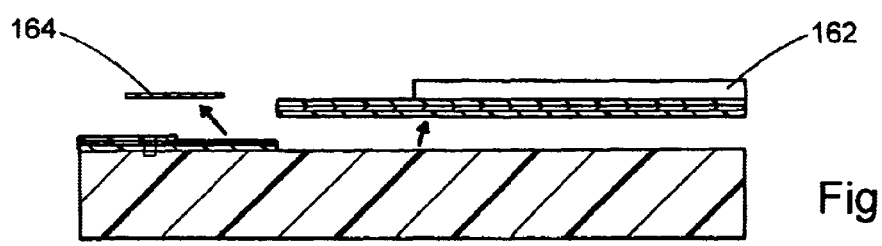

A clamping force is applied to the flatwire using a clamp 156 to hold rotary tool 150 against the flatwire. A push handle 158 is directed toward flatwire to drive the cutter 152 forward while rotating over the cutting lines. After cutting, cutter 152 is lifted from the flatwire and a cut strip 160 containing the flatwire is removed, as shown in FIG. 5c. However, if a subsystem 162 has failed then the entire subsystem is removed. In either case, a protective tape or film 164 covering the circuit traces is removed exposing same.

The cutting tools described above are configured to be used with or without cassette 28. After a flatwire circuit failure, the flatwire is removed from the system using a cutting device such as previously described, the protective films are peeled off from repair zones on the original portion and on the flatwire replacement portion or patch.

Figure 6A:
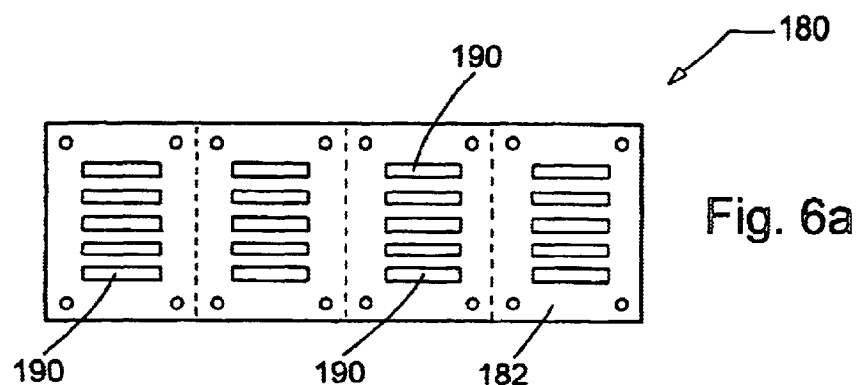
FIGS. 6a–6c are plan and cross-sectional views of a mending patch for mending flatwire, in accordance with the present invention.
Figure 6B:
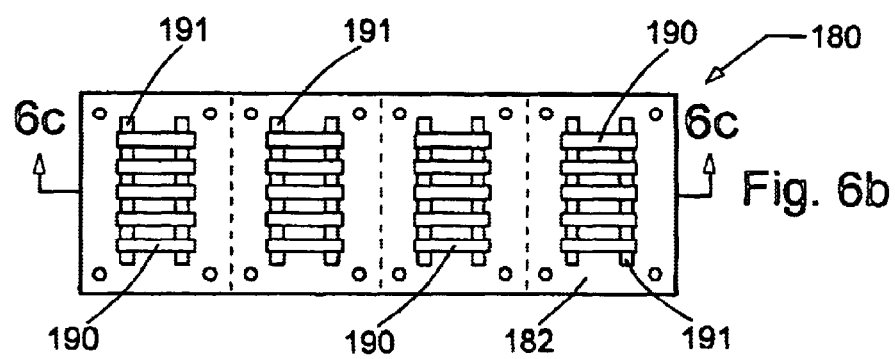
Figure 6C:
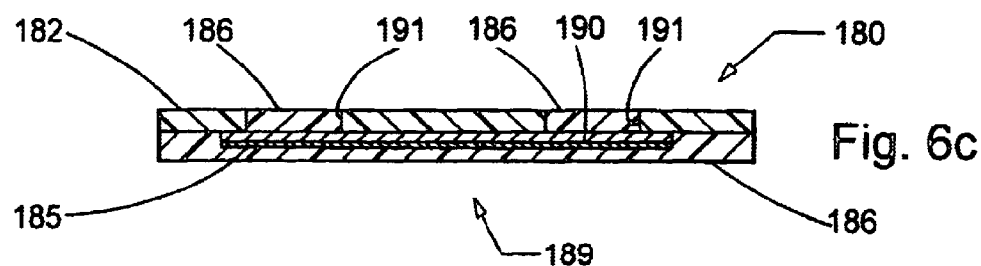

A flatwire replacement patch 180 is illustrated in FIGS. 6a–6c with and without soldering windows 191. Flatwire replacement patch 180 is constructed of a dielectric layer or substrate 182 supporting and a plurality of copper traces 190. Generally, the Substrate 182 may be a polyimide or similar material. The weight of the copper traces match the traces on the original flatwire part. Patch 180 may have an adhesive layer or be adhesive-less. The patch as shown is single sided. Since the original flatwire part and the replacement part or patch may be double sided, and may have a complex trace geometry, more than one patch may be used.

As shown in FIG. 6b patch 180 has windows 191 through the polyimide substrate exposing the copper traces 190. Windows 191 are temporarily protected with a removable window film. The window films disposed both sides of the patch. After a repair is complete, the protective film 186 is placed over the soldering windows.

In operation polyimide is in the path of the heat transfer between the heater 26 and solder 185. Since polyimide is a low thermal conductive material, it will take longer to reflow the solder if there isn't a solder window directly to the copper. However, advantageously a polyimide film placed over a low temperature substrate can prevent the substrate from over heating, especially for polyester substrates. The polyimide film also acts to keep surfaces of heater 26 clean.

In an embodiment of the present invention, bar code information located near the repair zones will specify the appropriate patch required. If more than one patch 180 is used, the sum of the patches traces will match the original and replacement part requirements. All patches are pre-fluxed during their manufacturing, and will have either a HASL or a SnPb finish. A protection tape 186 over the patch may be used to promote a long shelf-life. Protection tape 186 may have sufficient or extra flux in the adhesive. Each patch has at least four alignment holes for cooperating with to the original and replacement flatwire portions. The patch length (parallel to the copper traces) is approximately 12 mm. Preferably, repair patch 180, as shown in a cross-sectional view in FIG. 6c, has copper traces 190 having preformed solder 185 on a bottom-side, which is protected during storage, with a removable film 186.

Figure 7A:
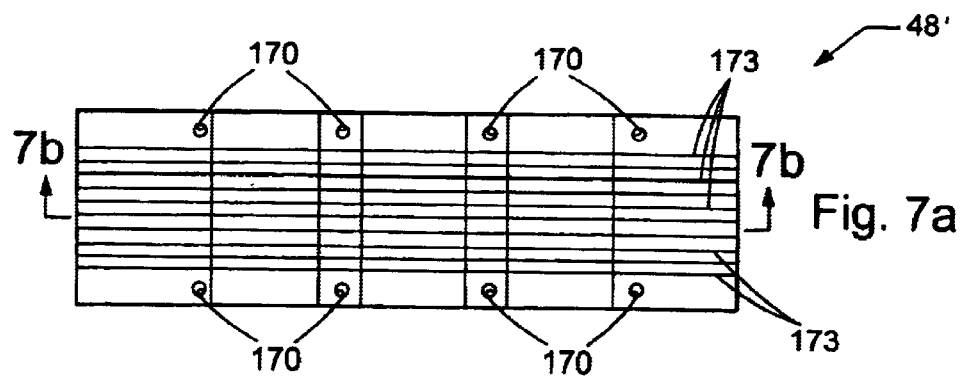
FIGS. 7a–7b illustrate a flatwire having preformed solder repair portions, in accordance with the present invention.
Figure 7B:
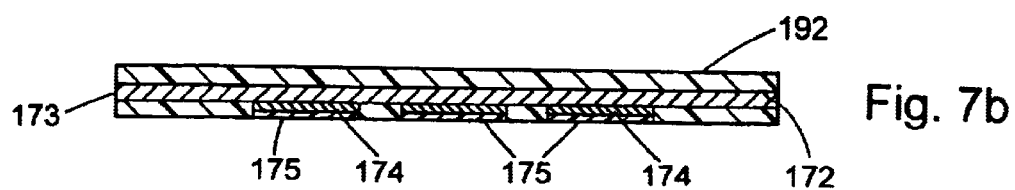

As shown in FIGS. 7a and 7b, an embodiment of a flatwire 48' having a polyester substrate 192 is provided. For this configuration of flatwire, a mending patch, as illustrated in FIGS. 6a–6c, is required.

Figure 7C:
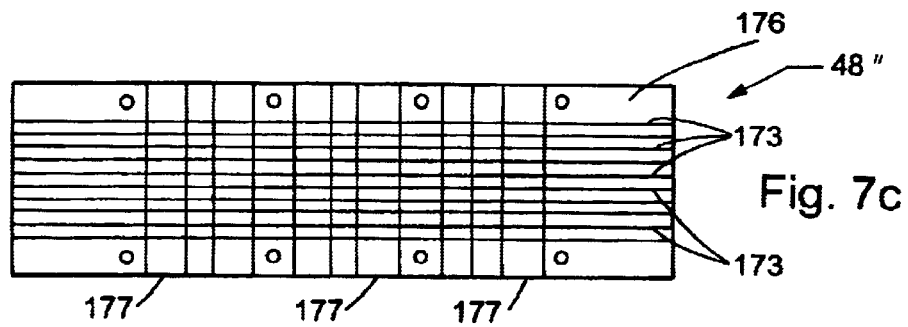
FIGS. 7c–7d are top and cross-sectional views of a flatwire having soldering of windows disposed opposite the preformed solder repair zones; in accordance with the present invention.
Figure 7D:
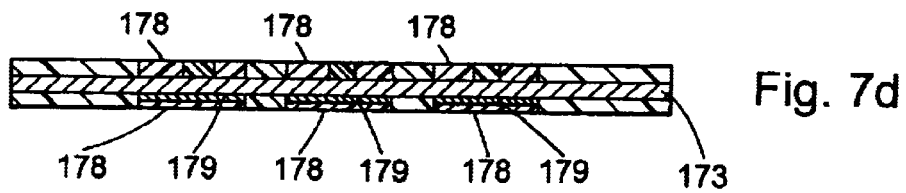

As described in previously embodiments, flatwire 48' has alignment apertures 170 along either side of substrate 192. Further, a plurality of copper traces 173 are adhered or similarly mounted to a surface 172 of substrate 192. As illustrated in a cross-sectional view in FIG. 7b preformed solder 174 is disposed at predefined intervals along traces 173. The preformed solder 174 is spread with a protective film 175 to prevent debris from contaminating the solder. In yet another embodiment, a flatwire 48" has a polyester substrate 176 and an integrated repair patch, as shown in FIGS. 7c and 7d. Thus, no separate repair patch is required. Further, in this embodiment, flatwire 48" has a polyimide material disposed in a soldering window 177 instead of polyester material. However, a polyimide material may be used for both the substrate and the window. As in the previous embodiments, flatwire 48" has a plurality of conductive traces 173, preferably made of copper, mounted to substrate 176. Opposite the soldering windows 177 is disposed preformed solder on traces 173. A removable protective film 178 is placed over the soldering window 177 as well as over the preformed solder 179. This flatwire configuration is directly solderable to any other flatwire without a mending patch.

Direct contact between heater 26 and copper traces 40, in an open soldering window 190 format provides an improved process, and enables the pulsed heater 26 to repair heavy copper power traces and flatwire that are attached to large heat sinks. Moreover, since the direct contact between the heater and the copper traces helps to heat up the solder quickly, the heat dissipation effect becomes less significant. However, it is possible that melted solder and flux will adhere to the surface of heater. Preferably, the heater is coated with a non-wetting metal, such as titanium, to alleviate the problem. Otherwise, the heater will need to be cleaned frequently.

Figure 8A:
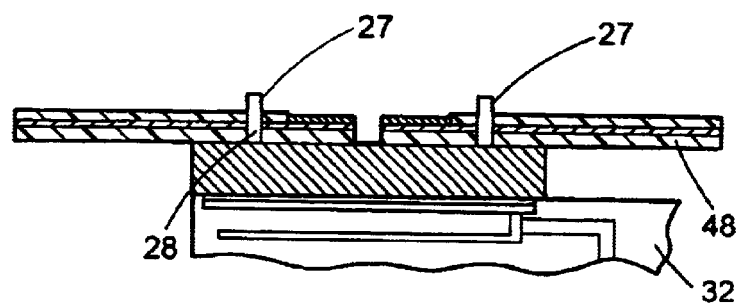
FIGS. 8a–8c are crossectional views through the flatwire and the repair tool (shown schematically) illustrating a method for joining two flatwire portions using a mending patch, in accordance with the present invention.
Figure 8B:
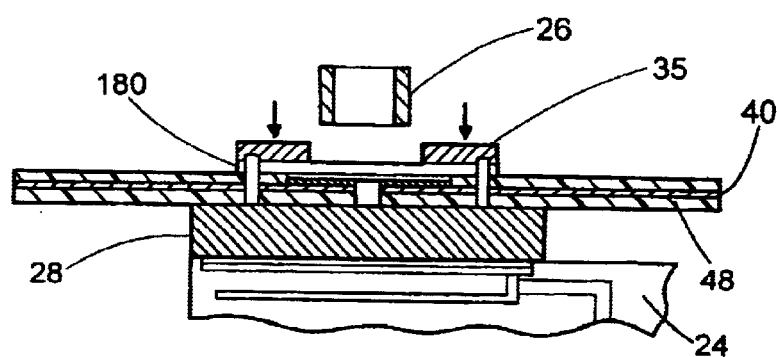
Figure 8C:
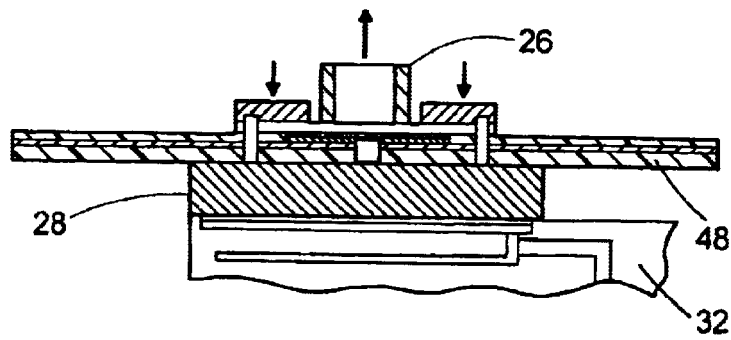

With reference to FIGS. 8a–8c, a method for repairing flatwire will now be described. In one embodiment of the present invention, flatwire 48 is repaired using mending patch 180, by first feeding flatwire 48 into soldering tool 20 (shown as a partial cut-away). The flatwire 48 is positioned and held in place by alignment pins 27 and 29 (see FIG. 1a) disposed on cassette 28 in soldering tool 20. Next, the mending patch 180, after removal of protective film 186, is laid over flatwire 48 such that a pre-soldered side 189 faces and aligns with copper traces 40 on a flatwire 48. Clamp 35 (in the cassette) is actuated to hold mending patch 180 against flatwire 48 in alignment therewith. In the meantime, heater 26 is turned on and heated-up to an operating temperature (which generally will take a few seconds). Once the temperature of heater 26 (shown schematically) reaches an operating level, the heater is released from a holding position and is pressed against the soldering windows of patch 180. The heater temperature is held at a reflow temperature level until the solder in the solder window melts. Thereafter, the heater supply power is switched off so that the heater temperature generally cools down to form high quality solder joints. The present invention contemplates using this repair method with all types or variations of polymeric substrates.

Figure 9A:
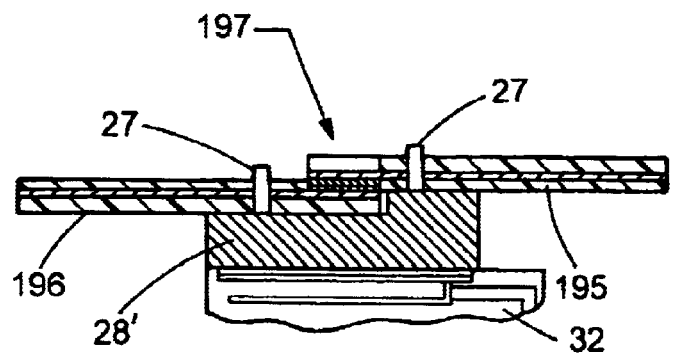
FIGS. 9a–9c are cross-sectional views through the flatwire and soldering tool (shown schematically) illustrating a method for joining two flatwire portions using an overlap joining process, in accordance with the present invention.
Figure 9B:
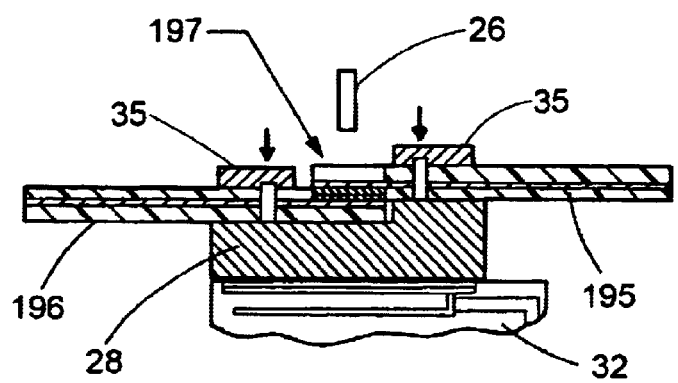
Figure 9C:
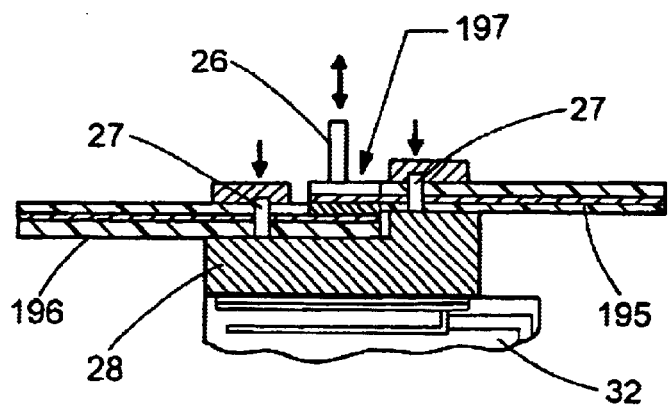

In an alternative embodiment of the present invention, a method for repairing flatwire 48 without using a separate mending patch 180 is provided. As shown in FIGS. 9a–c, after removal of the protective films, a first flatwire portion 196 positioned onto cassette 28', aligned and held in place by position pin 27 and 29 (not shown), and then a second flatwire portion 195 is laid over the first flatwire portion forming a lap joint 197. Further, the pre-soldered side of the copper traces face and align to the copper traces on the first flatwire portion 196. Clamp 35 is actuated to hold the over laid flatwire portions 195,196 in alignment In the meantime, heater 26 is switched on and heated-up to an operating temperature. Once the heater temperature reaches the operating temperature, heater 26 is released from a holding position (shown in FIG. 9b) and is pressed against the soldering windows of the flatwire (as shown in FIG. 9c). The heater temperature is held at the reflow temperature level until solder in the solder windows melt. Thereafter, the heater supply power is switched off so that the heater temperature cools down gradually to form high quality solder joints.

Figure 10A:
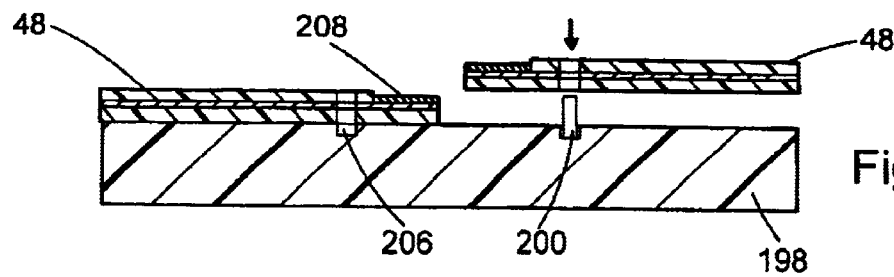
FIGS. 10–10c are cross-sectional views through two flatwire portions and a mending patch illustrating a method for joining the mending patch to the flatwire potions by heating solder disposed on the patch through windows in the patch, in accordance with the present invention.
Figure 10B:
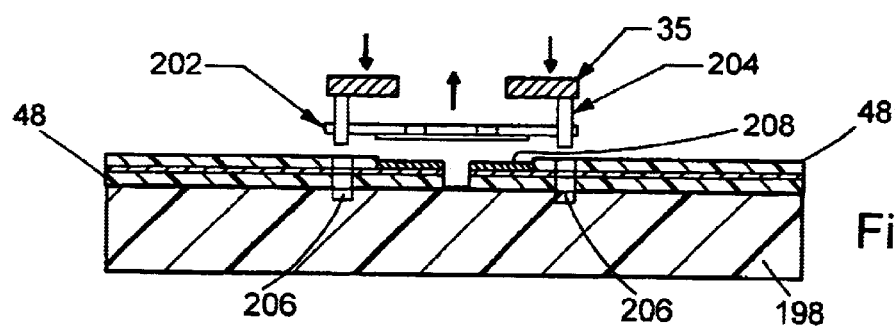
Figure 10C:
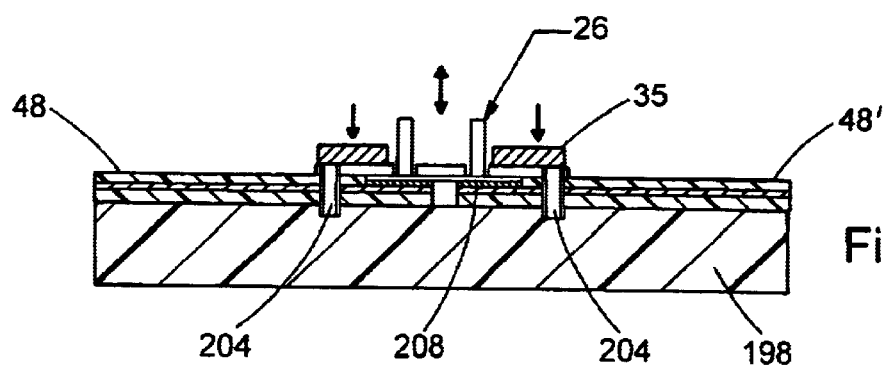

In embodiments where the flatwire 48 is attached to a plastic molded housing 198, a replacement flatwire 48' is pre-aligned using two temporary alignment pins 200, as illustrated in FIG. 10a. A mending patch 202 is loaded onto a clamp plate 35 with the exposed traces facing flatwire 48,48'. Next, soldering tool 20 is placed at the repair zone by inserting four alignment pins 204 into position holes 206 after the temporary alignment pins 200 are removed. Now that the flatwire 48,48' and repair patch 202 are aligned on clamp plate 35 and the tool is held in place, the heater power is switched on to bring the temperature up to an operating level. Once the heaters are at the operating temperature, heaters 26 are moved to contact the soldering window, as illustrated in FIG. 10c. The heaters 26 maintain a contact pressure and temperature until pre-formed solder 208 reflows. Then the electrical power supply is switched off so that the solder 208 can solidity gradually as the temperature cools down.

In still another embodiment of the present invention, the bar code is disposed adjacent each soldering zone. The bar code will designate the type of patch, upgrade/repair piece, process conditions for cutting and the soldering tool, as well as which cassette to use.

As any person skilled in the art of flatwire conductive systems will recognize from the previous detailed description and from the figures and claims, modifications and changes can be made to the preferred embodiments of the invention without departing from the scope of this invention defined in the following claims.

What is claimed is:

1. A device for soldering flatwire, the device comprising:
    a frame wherein the frame has an upper portion and a lower portion, and an upper handle and a lower handle wherein the upper handle is attached to the upper portion of the frame and the lower handle is attached to the lower portion of the frame;
    a first heater to the upper portion of the frame;
    a support base removably attached to the lower portion of the frame, wherein the support base stabilizes the flatwire to be soldered; and
    a heating control circuit provides a variable amount of energy to the first heater to maintain an operational temperature over a predetermined time period.

2. The device of claim 1 further comprising an inerting channel disposed in the upper and lower portion of the frame, wherein an inerting gas is injected between the upper and lower portion of the frame.

3. The device of claim 1 wherein the support base includes a plurality of alignment pins that cooperate with alignment apertures in the flatwire.

4. The device of claim 1 further comprising an inerting shroud for enclosing an area between the upper and lower portions of the frame.

5. The device of claim 1 wherein the support base includes a loading feature for holding the flatwire against a loading surface of the support base.

6. The device of claim 1, wherein the first heater further comprises a thermally conductive member.

7. The device of claim 6 further comprising a resistive heating element supported by the thermally conductive member.

8. The device of claim 7 wherein the resistive heating element is mounted to a ceramic substrate.

9. The device of claim 7 wherein the resistive heating element is planar.

10. The device of claim 7 wherein the resistive heating element is tubular in shape.

11. The device of claim 1, further comprising a second heater disposed on the support base for heating a bottom surface of the flatwire.

12. The device of claim 6 wherein the thermally conductive member is cylindrical.

13. The device of claim 6 further comprising a heat spreader disposed over the thermally conductive member for enhancing uniform heat distribution.

14. The device of claim 1, wherein the first heater further comprises a planar heating element, wherein the planar heating element includes:
    a thermally conductive plate; and
    a plurality of insulating plates,
    wherein the planar heating element is mounted to the thermally conductive plate and the insulated plates are mounted to the thermally conductive plate.

15. The device of claim 14 further comprising a housing having a lead frame for communicating electrical energy to the planar heating element.

16. The device of claim 14, wherein the first heater has two planar heating elements.

17. The device of claim 1, wherein the first heater further comprises a heater blade for contacting the flatwire and transmitting heat thereto.

18. The device of claim 17, further comprising a temperature sensor for sensing the temperature of the blade.

19. The device of claim 18 wherein the temperature sensor is a thermocouple.

20. A device for soldering flatwire, the device comprising:
    a frame wherein the frame has an upper portion and a lower portion;
    a heater affixed to the upper portion of the frame;
    a support base removably attached to the lower portion of the frame, wherein the support base stabilizes the flatwire to be soldered; and
    an inerting channel disposed in the upper and lower portion of the frame, for allowing an inerting gas to be injected between the upper and lower portion of the frame.

21. A device for soldering flatwire, the device comprising:
    a frame wherein the frame has an upper portion and a lower portion;
    a heater affixed to the upper portion of the frame;
    a support base removably attached to the lower portion of the frame, wherein the support base stabilizes the flatwire to be soldered; and
    an inerting shroud for enclosing an area between the upper and lower portions of the frame.

22. A device for soldering flatwire, the device comprising:
    a frame wherein the frame has an upper portion and a lower portion;
    a heater affixed to the upper portion of the frame;
    a support base removably attached to the lower portion of the frame, wherein the support base stabilizes the flatwire to be soldered; and
    an upper and lower handle, wherein the upper handle is attached to the upper portion of the frame and the lower handle is attached to the lower portion of the frame.

23. A device for soldering flatwire, the device comprising:
    a frame wherein the frame has an upper portion and a lower portion;
    a heater affixed to the upper portion of the frame, wherein the heater includes a resistive heating element mounted to a ceramic substrate; and
    a support base removably attached to the lower portion of the frame, wherein the support base stabilizes the flatwire to be soldered.

24. A device for soldering flatwire, the device comprising:
    a frame wherein the frame has an upper portion and a lower portion;
    a heater affixed to the upper portion of the frame, the heater includes a thermally conductive member;
    a heater spreader disposed over the thermally conductive member adapted to enhance uniform heat distribution; and
    a support base removably attached to the lower portion of the frame, wherein the support base stabilizes the flatwire to be soldered.

25. A device for soldering flatwire, the device comprising:
    a frame wherein the frame has an upper portion and a lower portion;
    a heater affixed to the upper portion of the frame, wherein the heater has a planar heating element, wherein the planar heating element includes a thermally conductive plate and a plurality of insulating plates mounted to the thermally conductive plate; and
    a support base removable attached to the lower portion of the frame, wherein the support base stabilizes the flatwire to be soldered.

26. The device of claim 25, further comprising a housing having a lead frame for communicating electrical energy to the planar heating element.

27. The device of claim 25, wherein the heater has two planar heating elements.

28. The device in claim 25, further comprising a clamp attached to the frame, the clamp is adapted to hold a mending patch.

\* \* \* \* \*

UNITED STATES PATENT AND TRADEMARK OFFICE
CERTIFICATE OF CORRECTION

PATENT NO. : 6,814,273 B2
DATED : November 9, 2004
INVENTOR(S) : Anne M. Sullivan et al.

It is certified that error appears in the above-identified patent and that said Letters Patent is hereby corrected as shown below:

Title page,
Item [57], ABSTRACT,
Line 9, after "flatwire" delete "two" and substitute -- to -- in its place.

Column 11,
Line 10, immediately after "portion" delete "," (comma).
Line 14, after "heater" insert -- affixed --.

Signed and Sealed this

Tenth Day of May, 2005

JON W. DUDAS
*Director of the United States Patent and Trademark Office*